United States Patent
Sondergeld et al.

(10) Patent No.: US 7,097,298 B2
(45) Date of Patent: Aug. 29, 2006

(54) INK RECEPTOR SHEET AND IT'S PROCESS OF USE

(75) Inventors: Manfred Sondergeld, Muehlheim (DE); Volker Struewe, Dietzenbach (DE)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/276,081

(22) PCT Filed: May 2, 2001

(86) PCT No.: PCT/US01/14162

§ 371 (c)(1),
(2), (4) Date: Nov. 15, 2002

(87) PCT Pub. No.: WO01/87636

PCT Pub. Date: Nov. 22, 2001

(65) Prior Publication Data

US 2003/0227530 A1    Dec. 11, 2003

(30) Foreign Application Priority Data

May 17, 2000    (DE) ................................ 001 10 550

(51) Int. Cl.
*B41J 2/01* (2006.01)
(52) U.S. Cl. ...................... 347/105; 347/101; 347/103; 428/32.1
(58) Field of Classification Search ................ 347/101, 347/105, 96, 95, 100, 103, 102; 428/195, 428/32.1

See application file for complete search history.

(56) References Cited

U.S. PATENT DOCUMENTS

| 5,023,129 | A | * | 6/1991 | Morganti et al. ........... 347/105 |
| 5,141,797 | A | | 8/1992 | Wheeler |
| 5,429,860 | A | | 7/1995 | Held et al. |
| 5,537,137 | A | | 7/1996 | Held et al. |
| 5,587,272 | A | * | 12/1996 | Grossa et al. ............... 430/257 |
| 5,766,398 | A | * | 6/1998 | Cahill et al. ................ 347/101 |
| 5,795,425 | A | | 8/1998 | Brault et al. |
| 5,952,151 | A | * | 9/1999 | Sondergeld .............. 430/270.1 |
| 5,984,467 | A | | 11/1999 | Bodager et al. |
| 6,165,654 | A | * | 12/2000 | Taylor et al. .................. 430/15 |
| 6,177,234 | B1 | * | 1/2001 | Metzger ..................... 430/291 |
| 6,294,308 | B1 | * | 9/2001 | Caspar et al. ............... 430/200 |

FOREIGN PATENT DOCUMENTS

| EP | 0782931 A1 | 7/1997 |
| WO | WO95/06564 | 3/1996 |

* cited by examiner

*Primary Examiner*—Manish S. Shah
(74) *Attorney, Agent, or Firm*—Thomas H. Magee

(57) ABSTRACT

An ink receptor sheet for ink jet printing, an ink jet printing system including an ink receptor sheet and a transfer element, a process for preparing an image on permanent support by ink jet printing, and an imaged article made by such process. By incorporation of a photopolymerizable layer into an ink receptor sheet, the handling latitude during lamination and peeling steps of ink jet printing processes was enhanced and durable and resistant images made by such ink jet printing processes were provided.

23 Claims, No Drawings

INK RECEPTOR SHEET AND IT'S PROCESS OF USE

FIELD OF INVENTION

The invention relates to an ink receptor sheet, a printing system comprising such an ink receptor sheet and a transfer element, a process for preparing an image on a permanent substrate by formation of an ink image, and an imaged article made by such a process.

BACKGROUND OF INVENTION

Ink jet printing is a well known process in the art to make multicolor images. It is a non-impact method for recording information in response to an electronic signal, such as that generated by a computer. In this process, ink droplets are emitted from a nozzle and deposited on substrates, mainly paper or polymer films and sheets, to form an ink image. To achieve high quality images in ink jet printing, the substrate is usually coated with at least one layer that rapidly absorbs the ink. For the inks are mainly composed of water and a colorant, such coating formulations are hydrophilic and contain appropriate absorptive materials.

It is also possible to transfer the ink image present on the ink receiving layer of an ink receiving sheet, comprising a temporary support and an ink receiving layer, to a permanent substrate. After peeling of the temporary support, the image is transferred to the permanent substrate.

Alternatively, the imaged ink receptor sheet may first be laminated to a transfer element. Then the temporary support of the ink receptor sheet is removed, the imaged ink receiving layer on the transfer element is then laminated to the desired permanent substrate, and finally the transfer element is removed.

Ink jet printing materials and transfer processes are known from U.S. Pat. No. 5,023,129, U.S. Pat. No. 5,141,797, and U.S. Pat. No. 5,984,467. Ink receptor sheets which provide ink images with improved durability are known from U.S. Pat. No. 5,429,860 and U.S. Pat. No. 5,537,137. These materials contain special compounds in the ink receiving layer which compounds are crosslinked by heat, by actinic radiation, or by chemical treatment after ink jet printing. Another method to provide durable ink jet images is disclosed in U.S. Pat. No. 5,766,398. This method provides images with a protective layer on the ink image by using an ink receptor sheet comprising a temporary support, a polymeric film, and an ink receiving layer. After applying an image by ink jet printing to the ink receiving layer, a substrate comprising an adhesive layer is laminated to the imaged ink receptor sheet, and the temporary support of the ink receptor sheet is removed, whereby the polymeric film is revealed as a protective layer of the ink image.

There are still problems with the ink jet materials and processes of the prior art, such as they often have narrow handling latitude during the required lamination and peeling steps. Either high lamination temperatures and slow lamination speeds are necessary or it is difficult to separate the right layers in the peeling steps to get the desired end result.

SUMMARY OF INVENTION

Therefore, it was an objective of the present invention to enhance the handling latitude during the required lamination and peeling steps of ink jet printing processes and/or to provide durable and resistant images made by such ink jet printing processes.

In a first aspect, this objective is achieved by an ink receptor sheet comprising a first temporary support and an ink receiving layer, characterized in that it additionally comprises a photopolymerizable layer between the first temporary support and the ink receiving layer.

In a second aspect, the invention is directed to an ink jet printing system comprising in combination an ink receptor sheet and a transfer element comprising a second temporary support and an adhesive layer.

In a third aspect, the invention is directed to a process for preparing an image on a permanent substrate comprising the steps of:

(a) imagewise applying at least one ink image on an ink, receptor sheet, wherein the ink receptor sheet comprises, in order:
 (1) a first temporary support,
 (2) a photopolymerizable layer,
 (3) and an ink receiving layer, and whereby the ink image is adjacent the ink receiving layer;
(b) contacting, typically laminating, the imaged ink receptor sheet to a transfer element comprising:
 (I) a second temporary support,
 (II) and an adhesive layer, whereby the ink image is adjacent the adhesive layer;
(c) ©removing the second temporary support to reveal the adhesive layer on top of the imaged ink receptor sheet,
(d) contacting, typically laminating, the imaged ink receptor sheet with a permanent substrate, whereby the adhesive layer is adjacent the permanent substrate,
(e) overall exposing with actinic radiation the permanent substrate and imaged ink receptor sheet sandwich through the first temporary support, and
(f) removing the first temporary support to reveal the final image on the permanent substrate, wherein the image is encased between the ink receiving layer and the adhesive layer. Typically an ink jet printer is used for the imagewise application of the image.

In a fourth aspect, the invention is directed to an imaged article comprising a permanent substrate, an adhesive layer, an image, typically an ink jet image, an ink receiving layer, and a photopolymerized layer.

DETAILED DESCRIPTION OF INVENTION

The present invention provides an ink receptor sheet which enhances the handling latitude during the required contacting, typically lamination, and peeling steps of ink jet printing transfer processes. It is not necessary to use special coated or treated synthetic resin films as temporary supports for the ink receptor sheet. No adhesion failure occurs during the peeling processes of temporary supports, even with non-pretreated temporary supports. Therefore, no edge lifting of layers or partial peel off of layer surfaces damaging the final images results. Furthermore, the present invention provides durable and resistant images made by such ink jet printing processes, and simultaneously provides a protective layer for the final images.

Ink Receptor Sheet

The ink receptor sheet comprises a temporary support, a photopolymerizable layer, and an ink receiving layer.

Temporary Support:

Suitable supports are, for example, synthetic resin films of polyethylene, polypropylene, polyamides, or polyesters. Polyethylene terephthalate films are particularly preferred. Supports having smooth or rough surfaces can be used. Support films having release layers or surfaces treated by electrical discharge are also suitable. The thickness of the support is usually at least about 12 Jim, typically about 20–200 µm, more typically about 75–150 µm.

Photopolymerizable Layer:

Preferably, the photopolymerizable layer in its non-photopolymerized state shows high adhesion to the ink receiving layer and the first temporary support, whereas the photopolymerizable layer in its photopolymerized state shows high adhesion to the ink receiving layer and low adhesion to the first temporary support.

The photopolymerizable layer comprises at least one polymeric binder, at least one photopolymerizable, ethylenically unsaturated monomer, and at least one photoinitiator or photoinitiator system.

Especially, the photopolymerizable layer comprises at least one polymer selected from the group consisting of polyvinylformal, polyvinyl butyral, polyvinyl alcohol, polyvinyl acetate, polyurethane esters, polyacrylates containing carboxylic groups, polymethacrylates, and copolymers of (meth)acrylic acid with (meth)acrylic esters, (meth)acrylic amides, vinyl compounds, styrene, and butadiene. Preferred are polyvinyl alcohols and copolymers of allcyl methacrylates, e.i. methyl methacrylate, ethyl methacrylate, butyl methacrylate, and alkyl acrylates, e.i. methyl acrylate, ethyl acrylate, butyl acrylate. Especially mixtures of such polymers are suitable. For aqueous coating solutions polymer latices are used. Also suitable are the crosslinked polymers disclosed in U.S. Pat. No. 4,892,802.

Conventional photopolymerizable, ethylenically unsaturated monomers may be used in the ink receptor sheets of this invention. Especially those disclosed in U.S. Pat. No. 4,892,802 are typical. Typically used are acrylic and methacrylic acid esters of polyols, such as, diethylene glycol diacrylate, 1,3-propanediol dimethacrylate, 1,5-pentanediol dimethacrylate, trimethylol propane trimethacrylate, bisacrylates or methacrylates of bisphenol A or its alkoxylated derivatives, and pentaerythritol tetraacrylate or methacrylates. More typically, the photopolymerizable layer comprises at least one monomer selected from the group consisting of trimethylol propane trimethacrylate, bisacrylates or methacrylates of bisphenol A, and pentaerythritol tetraacrylate or methacrylates.

As a photoinitiator or photoinitiator system, practically all compounds known for this purpose can be used. Typically compounds and systems are disclosed in U.S. Pat. No. 4,892,802. Epecially preferred are diacetyl, benzil, benzil dimethyl ketal, benzoin, benzoin methyl or ethyl ether, a combination of Michler's ketone and benzophenone, and systems of substituted thioxanthones and tertiary amines.

In addition to the main components described in the foregoing, the photopolymerizable layer of the present invention may comprise conventional additives like, for example, WV absorbers, thermal stabilizers, plasticizers, and fillers. In particular, the addition of fillers, such as, for example, silicates, aluminium oxides, and silicon dioxides are advantageous. Pyrogenic and precipitated silicic acids are preferred. Fillers are present in an amount of from about 0 to about 15% by weight, typically 0 to 10% by weight, based on the total weight of the layer.

The photopolymerizable layer of the invention generally comprises about 25 to about 75% by weight, typically about 35 to about 50% by weight of the polymeric binder; about 10 to about 60% by weight, typically about 15 to about 50% by weight of the photopolymerizable, ethylenically unsaturated monomer; about 0.1 to 10% by weight, typically about 1 to about 5% by weight of the photoinitiator or photoinitiator system; and about 0 to about 10% by weight, typically about 1 to about 10% by weight of additives; based on the total weight of the photopolymerizable layer.

The photopolymerizable layer of this invention can be prepared by generally known coating methods. For this purpose, aqueous as well as organic coating solutions can be used, as, for example, methylene chloride, toluene/methanol mixtures, or other mixtures of aromatic solvents and alcohols, esters, or ketones. Preferably, the photopolymerizable layer is made by emulsion coating. Subsequently, the coated layer is dried. The coating weight of the photopolymerizable layer is about 25 to about 80 mg/dm$^2$, typically about 40 to about 60 mg/dm$^2$.

Ink Receiving Layer

In general, all ink receiving materials of the state of the art, including those which are composed of at least two layers, can be used for preparing the ink receiving layer of this invention. Suitable ink receiving materials are described in U.S. Pat. No. 5,023,129, U.S. Pat. No. 5,141,797, U.S. Pat. No. 5,984,467, U.S. Pat. No. 5,429,860 and U.S. Pat. No. 5,537,137. Preferably, the ink receiving layers of the present invention are non-tacky. The ink receiving layer of the present invention typically comprises at least one hydrophilic polymer. More typically, the ink receiving layer comprises at least one polymer selected from the group consisting of homo- and copolymers of vinyl alcohol and/or pyrrolidone; homo- and copolymers of acrylic acid, methacrylic acid, and/or maleic acid and/or maleic acid anhydride, and/or their metal salts and/or their amine salts; gelatine, and starch. Especially mixtures of polyvinyl alcohols and/or copolymers of maleic acid or maleic acid anhydride with comonomers like methyl vinyl ether, are used. The hydrophilic polymer generally will be water-soluble in order that it may be applied using conventional aqueous coating techniques.

Additional compounds of the ink receiving layer may be, for example, UV absorbers, coating additives, plasticizers, and fillers. When polymers comprising acid groups are used, preferably compounds which neutralize these acid groups are added to adjust the pH value. Typically, amines are used; especially tertiary amines like triethanol amine, are used. In particular, the addition of fillers, such as, for example, silicates, aluminium oxides, and silicon dioxides is advantageous. Pyrogenic and precipitated silicic acids are preferred. Fillers are present in an amount of from about 0 to about 15% by weight, typically about 0 to about 10% by weight, based on the total weight of the layer.

The ink receiving layer of this invention can be prepared by generally known coating methods. Subsequently, the coated layer is dried. The coating weight of the ink receiving layer is about 50 to about 150, typically about 60 to about 100 mg/dm$^2$.

Transfer Element

The transfer element of the present invention comprises a temporary support and an adhesive layer. Suitable supports are, for example, synthetic resin films of polyethylene, polypropylene, polyamides, or polyesters. Polyethylene terephthalate films particularly preferred. Supports having smooth or rough surfaces can be used. Support films having release layers or surfaces treated by electrical discharge are also suitable. The thickness of the support is usually at least about 12 gm, typically about 20-about 130 µm, more typically at about 50 to about 100 µm.

The adhesive layer may comprise at least one thermoplastic polymer, for example at least one polymer selected from the group consisting of acrylate and methacrylate copolymers, vinyl acetate copolymers, and polyamides. Preferably the adhesive layer of the transfer element comprises at least one crystalline polymer. Especially preferred are polyeaprolactones. The adhesive layer can also contain additives, such as, for example, surfactants and fillers. In particular, addition of fillers, such as, for example, silicates, aluminium oxides, and silicon dioxides are advantageous. Pyrogenic and precipitated silicic acids are preferred. Fillers are present in an amount of from about 0 to about 15% by weight, typically about 0 to about 0% by weight, based on the total weight of the layer.

The transfer element of this invention can be prepared by known methods. For this purpose, coating solutions for forming the adhesive layer can be coated on the supports from currently available solvents, preferably organic solvents, such as, for example, methylene chloride, toluene/methanol mixtures, or other mixtures of aromatic solvents and alcohols, esters, or ketones and subsequently dried. The coating weight of the adhesive layer is about 30 to about 100 mg/dm$^2$, typically about 40 to about 80 mg/dm$^2$.

Inks

The inks used in the ink jet printing process of the present invention are well known in the art. The ink compositions usually comprise a carrier medium, normally water, and a colorant, which may be a dye or a pigment dispersion. Furthermore, additives like detergents, thickeners, organic solvents, etc. may be present. Suitable ink compositions are described in U.S. Pat. No. 5,984,467 and U.S. Pat. No. 5,537,137.

Permanent Substrate

The imaged ink receptor sheet of the present invention may be applied to many types of permanent substrates by use of the adhesive layer of the transfer element. Some permanent substrates include paper, polymer foils, metal, or card board.

Applications

The ink receptor sheet provided by the present invention may receive ink printed by conventional ink jet printers, such as thermal or bubble jet printers, piezoelectric printers, continuous flow printers, or valve jet printers. After the ink is printed on the ink receiving layer of the ink receptor sheet, the printed sheet is air dried.

Then a transfer element is contacted to the imaged ink receptor sheet. Typically, it is laminated with a conventional laminator, e.g. an EasySprint® Desktop laminator (E. I du Pont de Nemours& Company, Wilmington, Del.). The temperature of the laminator rollers is usually at least about 80° C., typically about 90 to about 130° C.

The temporary support of the transfer element is peeled off manually or automatically, whereby the adhesive layer of the transfer element is transferred to the imaged ink receptor sheet. The temporary support is peeled off preferably after cooling to room temperature. More typical is an additional hold time of 1–5 min.

The imaged ink receptor plus the adhesive layer from the transfer element are then contacted, typically laminated, like in the previous contact/lamination step to a permanent substrate. After this contact, typically lamination, the photopolymerizable layer of the ink, receptor sheet and permanent substrate sandwich is overall exposed with actinic radiation through the temporary support of the ink receptor sheet for about 10 to about 30 sec. Some examples of suitable radiation sources are xenon lamps, mercury vapor lamps and carbon-arcs, laser fluorescent lamps with fluorescent materials emitting UV radiation and electronic flash devices.

Afterwards, the temporary support of the ink receptor sheet is easily peeled off to reveal the final ink jet image, encased between the adhesive and the ink receiving layers, and protected by the photopolymerized layer, on the permanent substrate. The temporary support of the ink receptor sheet is peeled off manually or automatically, typically after cooling to room temperature. More typical is an additional hold time of about 1 to about 5 min.

The overall exposure of the photopolymerizable layer of the ink receptor sheet can also be carried out before instead of after contacting, typically laminating, the imaged ink receptor sheet plus the adhesive layer from the transfer element to the permanent substrate.

Furthermore, it is possible to contact, typically laminate, a photosensitive layer to the imaged ink receiving layer of the ink receptor sheet under the same process conditions as described above before a transfer element is applied. Suitable photosensitive materials are positive- and negative-working materials as those disclosed in U.S. Pat. No. 3,649,268, U.S. Pat. No. 4,174,216, U.S. Pat. No. 4,892,802, and U.S. Pat. No. 4,053,313. Typically, photosensitive materials are those of U.S. Pat. No. 4,892,802.

This photosensitive layer is imagewise exposed with actinic radiation by using radiation sources like those previously described to produce tacky and non-tacky areas. The photosensitive layer may comprise a strippable base on its top which may be stripped before or after imagewise exposure. Suitable materials for such bases are synthetic resin films of polyethylene, polypropylene, polyamides, or polyesters. Then a toner is applied to the tacky areas of the imagewise exposed photosensitive layer. Powder toners as well as pigmented foils may be used. Such toner materials are disclosed in U.S. Pat. No. 3,649,268; U.S. Pat. Nos. 3,620,726; 3,909,282; and U.S. Pat. No. 5,372,910 and U.S. Pat. No. 5,427,894. These additional steps of applying a photosensitive layer, imagewise exposing it, and adding a toner may be repeated at least twice. Then the further steps of the transfer process according to the present invention are conducted as described above.

It is also possible to laminate an imaged ink receptor sheet of the present invention to an adhesive coated permanent substrate without transferring the imaged ink receptor sheet to a transfer element. All further process steps are conducted as described previously. The adhesive coated permanent substrate preferably comprises an adhesive layer like that of the transfer element. A transfer element of this invention may be laminated to any substrate to form this adhesive layer.

INDUSTRIAL UTILITY

The ink receptor sheet, the ink jet printing system comprising the ink receptor sheet and a transfer element as well as the processes of the present invention have commercial utility for ink jet printing technologies, especially with aqueous ink dispersions. Pictorial as well as textured information may be printed. For multicolored images, yellow, cyan, magenta, and black inks may be used to advantage. Applications include desktop publishing, as well as wide format applications such as the printing of signs, banners, and the like. High quality images may be printed on a broad variety of substrates.

EXAMPLES

The following examples illustrate the invention, but do not limit it. Parts and percentages are by weight, unless otherwise stated. The average molecular weights of the polymers are given as weight average (Mw). Percent hydrolysis is given as mole percent hydrolysis of acetate groups on dry basis.

Example 1

(I) Ink Receptor Sheet

Photopolymerizable Layer 7 g of Elvanol® 52–22 (E. I du Pont de Nemours& Company, Wilmington, Del.; polyvinyl alcohol, 87–89% hydrolysis, viscosity of aqueous solution (4% solids) at 20° C. by Hoeppler falling ball method: 21–26 mPa s) were dissolved in 96.4 g water. 3.5 g Irgacure® 651 (benzil dimethyl ketal) were dissolved in 25.9 g TMPTMA (trimethylol propane timethacrylate). This monomer/initiator solution was added to the Elvanol® solution and emulsified with a high speed mixer for 5 min. The emulsion was diluted with 150 g water and 67.2 g Plextol® D540 (Polymer Latex, Marl, Germany; aqueous dispersion of acrylic polymer based on methyl methacrylate and n-butyl acrylate, Brookfield viscosity 3–10 Pa s, 50% of solids) were added and mixed under moderate stirring. The emulsion/dispersion was coated with a doctor knife onto a 125 µm thick untreated polyester base which formed the temporary support of the ink receptor sheet and dried at room temperature. The resulting coating weight was 60 mg/dm$^2$.

Ink Receiving Layer 3.6 g Gantrez® S97 (ISPEurope, Guildford, GB; free acid of methyl vinyl ether/maleic anhydride copolymer, about Mw 2,200,000) were dissolved in 182.5 g water. 2.13 g Ludox® LS (E. I du Pont de Nemours& Company, Wilmington, Del.; colloidal silica in water, 30% of solids) were added and mixed. 2.8 g triethanolamine were added and mixed. 8.96 g Elvanol® 52–22 were added and stirred until dissolved. The final solution had a pH of 5.3 and a viscosity of 660 cP. The solution was coated with a Meyer bar onto the above mentioned photopolymerizable layer and dried at room temperature. The coating weight of the ink receiving layer was 80 mg/dm$^2$.

Transfer Element 10.56 g Capa® 650 (Solvay Interox, Warrington, GB; polycaprolactone Mw 50,000, melting range Tm 58–60° C., glass transition temperature range Tg –60 to –70° C.) were dissolved in 80.1 g toluene and 8.9 g methanol. 0.44 g Acemattf OK607 (Degussa Hüls; Germany; precipitated silica, 2 µm particle size) were added and dispersed under vigorous stirring. The solution was coated with a doctor knife onto a 50 µm thick release treated polyester base which formed the temporary support of the transfer element and dried at room temperature to form an adhesive layer. The coating weight was 60 mg/dm$^2$.

Process of Use

A wrong reading 4—color image was printed onto the ink receptor sheet with an AX-4 Digital Cromalin® ink jet printer (E. I du Pont de Nemours & Company, Wilmington, Del.). A very uniform print with complete ink acceptance and no image disturbances or "beading" was achieved. Only slight surface tackiness was observed directly after printing in areas where all 4 colors had been printed 100% on top of each other. After 10 min. drying at room temperature the entire surface was found to be non-tacky.

The transfer element was laminated to the imaged ink receptor sheet with an EasySprint® Desktop laminator (E. I du Pont de Nemours & Company, Wilmington, Del.) at 115° C. roller temperature wherein the adhesive layer of the transfer element adhered to the imaged ink receiving layer. After cooling to room temperature and a 1 min. hold time the temporary support of the transfer element was peeled off without any residues. The adhesive layer of the transfer element was completely transferred to the printed ink receptor sheet without any adhesion failure or edge lifting at the photopolymerizable layer/temporary support interface of the ink receptor sheet.

The ink receptor sheet plus the adhesive layer of the transfer element were laminated to a 120 g/m$^2$ Ikonorex® paper (Ikono Zanders, Germany) with an EasySprint® Desktop laminator at 115° C. roller temperature. After the lamination the photopolymerizable layer was overall exposed through the temporary support of the ink receptor sheet for 15 sec in a commercial 1000 W UV exposure frame to render the photopolymerizable layer non-tacky. After the exposure the temporary support of the ink receptor sheet was easily peeled off without any damage of the surface or any adhesion failure between the layers or to the paper substrate.

Example 2

Ink Receptor Sheet

Photopolymerizable Layer 3.5 g Elvanol® 52–22 were dissolved in 46.8 g water. 1.75 g Irgacure® 651 were dissolved in 12.95 g TMPTMA. The monomer/initiator solution was emulsified in the Elvanol® solution as described in Example 1. The emulsion was diluted with 40 g water and 35 g Primal® CS-4000 (Rohm & Haas, Germany; aqueous dispersion of acrylic polymer, 48% of solids) was stirred in. The emulsion/dispersion was coated with a doctor knife onto a 125 gm thick untreated polyester base which formed the temporary support of the ink receptor sheet and dried at room temperature. The coating weight was 60 mg/dm$^2$.

Ink Receiving Layer 3.19 g Gantrez® ANI 19 (ISPEurope, Guildford, GB; methyl vinyl ether/maleic anhydride copolymer, Mw about 2,160,000) were dissolved in 133.5 g water at 80° C. 9.9 g Elvanol® 52–22 were added and dissolved at 80° C. After cooling to room temperature 3.05 g triethanolamine were added and mixed. The final solution had a pH of 5.8 and a viscosity of 380 cP. The solution was coated onto the photopolymerizable layer and dried as described in example 1. The coating weight was 60 mg/dm$^2$.

Process of Use as Described in Example 1

After printing onto the ink receptor sheet, the surface was only slightly tacky over areas where all 4 colors had been printed 100% on top of each other. After laminating the transfer element to the imaged ink receptor sheet and peeling the temporary support of the transfer element, the photopolymerizable layer was overall exposed. The imaged and exposed ink receptor sheet with the adhesive layer on top was then laminated to a 100 µm thick corona treated polyethylene foil. The temporary support of the ink receptor sheet was peeled off easily without any damage of the surface or any adhesion failure between the layers or to the polyethylene foil.

Example 3

Ink Receptor Sheet

Photopolymerizable Layer 12 g Elvacite® 2044 (E. I du Pont de Nemours & Company, Wilmington, Del.; butyl methacrylate copolymer), 7 g TMPTA and 1 g Irgacure® 651 were dissolved in 80 g toluene. The solution was coated with a doctor knife onto a 125 Jim thick untreated polyester base which formed the temporary support of the ink receptor sheet and dried at room temperature. The coating weight was 40 mg/dm².

Ink Receiving Layer 3.19 g Gantrez ®AN119 were dissolved in 133.5 g water at 80° C.9.9 g Moviol® 4–88 (Clariant GmbH, Germany; polyvinyl alcohol, 88% hydrolysis, viscosity 4 mPa s) were added and dissolved at 80° C. After cooling to room temperature 3.05 g triethanolamine were added and mixed. The final solution had a pH of 5.4 and a viscosity of 140 cP. The solution was coated onto the photopolymerizable layer and dried as described in example 1. The coating weight was 80 mg/dm².

Process of Use as Described in Example 1

After printing onto the ink receptor sheet, the surface was only slightly tacky over areas where all 4 colors had been printed 100% on top of each other. After laminating the transfer element to the printed ink receptor sheet and peeling the temporary support of the transfer element, the imaged ink receptor sheet with the adhesive layer on top was laminated to a 200μ thick aluminum foil. After the overall exposure of the photopolymerizable layer the temporary support of the ink receptor sheet was easily peeled off without any damage of the surface or any adhesion failure between the layers or to the aluminum foil.

Example 4

A wrong reading 4—color image was printed as described in Example 1 onto an ink receptor sheet according to Example 1. Then a positive Cromalin® sheet (E. I du Pont de Nemours & Company, Wilmington, Del.), after removal of its cover sheet, was laminated on top of the imaged ink receiving layer with an EasySprint® Desktop laminator (E. I du Pont de Nemours & Company, Wilmington, Del.) at 115° C. roller temperature. This layer was imagewise exposed through its base to provide tacky and non-tacky areas. The base was peeled off, and a white powder toner was applied to the tacky areas to provide a background image for the ink jet image. The transfer element was then laminated to the imaged ink receptor sheet as described in Example 1 and the temporary support of the transfer element was peeled off without any residues. The adhesive layer of the transfer element was completely transferred to the printed ink receptor sheet without any adhesion failure or edge lifting at the photopolymerizable layer/temporary support interface of the ink receptor sheet.

The imaged ink receptor sheet plus the toned Cromalin® layer plus the adhesive layer of the transfer element were laminated to a clear polyester base with an EasySprint® Desktop laminator at 115° C. roller temperature. After the lamination the photopolymerizable layer was overall exposed through the temporary support of the ink receptor sheet for 15 sec in a commercial 1000 W UV exposure frame to render the photopolymerizable layer non-tacky. After the exposure the temporary support of the ink receptor sheet was easily peeled off without any damage of the surface or any adhesion failure between the layers or to the paper receptor.

Comparative Example 1

The solution for the ink receiving layer of Example 1 was directly coated onto a 125 μm thick untreated polyester base which formed the temporary support of the ink receptor sheet as described in Example 1. The coating weight was 80 mg/dm².

A wrong reading 4—color image was printed onto this ink receptor sheet as described in example 1 and basically the same results were obtained as described in Example 1.

The same transfer element as in Example 1 was laminated to the imaged ink receptor sheet with an EasySprint® Desktop laminator at 115° C. roller temperature. After cooling to room temperature and a 1 min hold time, an attempt was made to peel off the temporary support of the transfer element. However, because of the insufficient adhesion of the imaged ink receiving layer to the temporary support, the imaged ink receiving layer was transferred to the transfer element. Because of this adhesion failure the printed image could not be transferred to a permanent substrate.

Comparative Example 2

The solution for the ink receiving layer of Example 1 was directly coated onto a 100 μm thick corona treated polyester base which formed the temporary support of the ink receptor sheet as described in Example 1. The coating weight was 80 mg/dm².

A wrong reading 4—color image was printed onto this ink receptor sheet as described in Example 1 and basically the same results were obtained as in Example 1.

The transfer element was laminated to the imaged ink receptor sheet with an EasySprint® Desktop laminator at 115° C. roller temperature. After cooling to room temperature and a 1 min. hold time, the temporary support of the transfer element was peeled off without any residues. The adhesive layer of the transfer element was completely transferred to the imaged ink receptor sheet without any adhesion failure or edge lifting at the ink receiving layer/temporary support interface.

The ink receptor sheet plus the adhesive layer of the transfer element were laminated to a 120 g/m2 Ikonorex® paper with an EasySprint® Desktop laminator at 115° C. roller temperature. After cooling to room temperature and a 1 min. hold time, the temporary support of the ink receptor sheet could barely be peeled off. The surface of the ink receiving layer was damaged and some areas of the printed image were pulled off with the temporary support. The final proof was unusable.

What is claimed is:

1. An ink receptor sheet comprising, in order:
   (a) a first temporary support,
   (b) a photopolymerizable layer, and
   (c) an ink receiving layer comprising at least one hydrophilic polymer,
   wherein said photopolymerizable layer comprises at least one polymeric binder, at least one photopolymerizable, ethylenically unsaturated monomer, and at least one photoinitiator or photoinitiator system.

2. The ink receptor sheet of claim 1 wherein the photopolymerizable layer in its non-photopolymerized state exhibits high adhesion to the ink receiving layer and the first temporary support, whereas in its photopolymerized state it exhibits high adhesion to the ink receiving layer and low adhesion to the first temporary support.

3. The ink receptor sheet of claim 1 wherein the polymeric binder is selected from the group consisting of polyvinylformal, polyvinyl butyral, polyvinyl alcohol, polyvinyl acetate, polyurethane esters, polyacrylates containing carboxylic groups, polymethacrylates, and copolymers of(meth)acrylic acid with (meth)acrylic esters, (meth)acrylic amides, vinyl compounds, styrene, and butadiene.

4. The ink receptor sheet of claim 1 wherein the monomer is selected from the group consisting of trimethylol propane trimethacrylate, bisacrylates or methacrylates of bisphenol A or its alkoxylated derivatives, and pentaerythritol tetraacrylate or metbacrylate.

5. The ink receptor sheet of claim 1 wherein the hydrophilic polymer is selected from the group consisting of homo- and copolymers of vinyl alcohol, and pyrrolidone or combination thereof homo- and copolymers of acrylic acid, methacrylic acid, maleic acid and maleic acid anhydride, and their metal salts and their amine salts or combination thereof, gelatine, and starch.

6. An ink jet printing system comprising in combination:
   (I) an ink receptor sheet comprising in order:
      (1) a first temporary support,
      (2) a photopolymerizable layer, and
      an ink receiving layer, and
   (II) a transfer element comprising:
      (1) a second temporary support, and
      (2) an adhesive layer.

7. The ink jet printing system of claim 6 wherein the adhesive layer of the transfer element comprises at least one thermoplastic polymer.

8. The ink jet printing of claim 7 wherein the thermoplastic polymer is selected from the group consisting of acrylate and methacrylate copolymers, vinyl acetate copolymers, and polyamides.

9. An ink jet printing system of claim 6 wherein the adhesive layer of the transfer element comprises at least one crystalline polymer.

10. An ink jet printing system of claim 9 wherein the crystalline polymer is polycaprolactone.

11. A process for preparing an image on permanent substrate comprising the steps of:
   (a) imagewise applying at least one ink image on an ink receptor sheet wherein the ink receptor sheet comprises, in order:
      (1) a first temporary support,
      (2) a photopolymerizable layer, and
      (3) an ink receiving layer, and whereby the ink image is adjacent the ink receiving layer
   (b) contacting the imaged ink receptor sheet with a transfer element comprising:
      (I) a second temporary support, and
      (II) an adhesive layer, whereby the ink image is adjacent the adhesive layer;
   (c) removing the second temporary support to reveal the adhesive layer on top of the imaged ink receptor sheet,
   (d) contacting the imaged ink receptor sheet with a permanent substrate, whereby the adhesive layer is adjacent the permanent substrate,
   (e) overall exposing with actinic radiation the permanent substrate and imaged ink receptor sheet formed in step (4) through the first temporary support, and
   (f) removing the first temporary support to reveal the final image on the permanent substrate, wherein the image is encased between the ink receiving layer and the adhesive layer.

12. The process of claim 11 wherein contacting of steps (b) or (d) or both comprises laminating.

13. The process of claim 11 wherein the overall exposure of step (e) is carried out before instead of after step (d).

14. The process of claim 11 further comprising the following additional process steps, in order, between steps (a) and (b):

(g) laminating a photosensitive layer to the ink image adjacent the receiving layer of the ink receptor sheet,
   (h) imagewise exposing the photosensitive layer with actinic radiation to produce tacky and non-tacky areas, and
   (i) applying a toner to the tacky areas.

15. The process of claim 14 wherein steps (g) to (i) are repeated at least once between steps (a) and (b).

16. The process of claim 15 wherein the photosensitive layer has a strippable base.

17. The process of claim 16 wherein the strippable base is removed before or after step (h).

18. The process of claim 14 wherein the photosensitive layer is a tacky, photopolymerizable layer.

19. The process of claim 14 wherein toner is selected from the group consisting of a pigmented toner powder and a pigmented foil in step (i).

20. A process for preparing an image on a permanent substrate comprising the steps of:
   (a') imagewise applying at least one ink image on an ink receptor sheet,
      wherein the ink receptor sheet comprises, in order:
      (1) a first temporary support,
      (2) a photopolymerizable layer, and
      (3) an ink receiving layer onto which the ink is imagewise applied,
   (b') contacting the imaged ink receptor sheet with a element comprising:
      (I) a permanent support, and
      (II) an adhesive layer, whereby the ink image is adjacent the adhesive layer
   (c') overall exposing the imaged ink receptor sheet through the first temporary support with actinic radiation, and
   (d') removing the first temporary support to reveal the final image on the permanent substrate,
   wherein said photopolymerizable layer comprises at least one polymeric binder, at least one photopolymerizable, ethylenically unsaturated monomer, and at least one photoinitiator or photoinitiator system.

21. The process of claim 20 further comprising the process, in order, between steps (a') and (b'):
   (g') laminating a photosensitive layer to the imaged ink receiving layer of the ink receptor sheet,
   (h') imagewise exposing the photosensitive layer with actinic radiation to produce tacky and non-tacky areas, and
   (i') applying a toner to the tacky areas.

22. An imaged article comprising, in order:
   (1) a permanent substrat,
   (2) an adhesive layer,
   (3) an ink image,
   (4) an ink receiving layer, and
   (5) a photopolymerized layer,
   wherein said photopolymerized layer having been polymerized from the layer comprising at least one polymeric binder, at least one photopolymerizable, ethylenically unsaturated monomer, and at least one photoinitiator or photoinitiator system.

23. The imaged article of claim 22 wherein the ink image is formed by application of an ink jet ink.

* * * * *